(12) United States Patent
Hollenbeck et al.

(10) Patent No.: US 6,559,723 B2
(45) Date of Patent: May 6, 2003

(54) SINGLE ENDED INPUT, DIFFERENTIAL OUTPUT AMPLIFIER

(75) Inventors: Neal W. Hollenbeck, Palatine, IL (US); Lawrence Edwin Connell, Naperville, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/946,030

(22) Filed: Sep. 4, 2001

(65) Prior Publication Data

US 2003/0042983 A1 Mar. 6, 2003

(51) Int. Cl.[7] .................................................. H03F 3/04
(52) U.S. Cl. ..................... 330/301; 330/253; 330/327; 330/318
(58) Field of Search ................................ 330/301, 253, 330/261, 302; 327/318, 359, 543

(56) References Cited

U.S. PATENT DOCUMENTS

| | | | |
|---|---|---|---|
| 5,065,043 A | * 11/1991 | Bartling et al. | 327/543 |
| 5,497,123 A | 3/1996 | Main et al. | 330/301 |
| 5,767,662 A | 6/1998 | Perkins | 330/257 |
| 5,946,878 A | * 9/1999 | Grund et al. | 327/359 |
| 6,150,881 A | * 11/2000 | Lovelace et al. | 327/318 |

* cited by examiner

Primary Examiner—Timothy P. Callahan
Assistant Examiner—Linh Nguyen
(74) Attorney, Agent, or Firm—Jonathan P. Meyer

(57) ABSTRACT

A single ended input differential output amplifier (100) and integrated circuit including such an amplifier (100). A pair of load resistors (102, 104) are connected between a supply voltage ($V_{dd}$) and differential outputs OUTP and OUTM. An inductor (106) is connected between input RFIN and a source bias voltage $V_{BS}$. A first field effect transistor (FET) (108) is connected, drain to source, between load resistor (102) at output OUTP and inductor (106) at RFIN. A second FET (110) is connected, drain to source, between the second load resistor (104) at output OUTM and the source bias voltage $V_{BS}$. A gate bias voltage $V_{Bg}$ is connected to the gate of FET (108) and through resistor (112) to the gate of FET (110). A coupling capacitor (114) is connected between the input RFIN and the gate of FET (110). The gate of FET (108) may be connected to gate bias voltage $V_{Bg}$ through a second gate bias resistor (122) and a second coupling capacitor (124) may couple the source of FET (110) to the gate of FET (108), thereby providing common mode rejection for noise, e.g., substrate noise, experienced at inductor (106).

25 Claims, 1 Drawing Sheet

SINGLE ENDED INPUT, DIFFERENTIAL OUTPUT AMPLIFIER

BACKGROUND OF THE INVENTION

1. Field of the Invention

The present invention is related to wide band linear amplifiers and more particularly to resistively loaded wideband high frequency linear amplifiers with a single ended input and a differential output.

2. Background Description

Wide band multi-channel communication systems require wide band amplifiers with a high degree of linearity to avoid second and third order affects arising from a large number of potential carrier interactions. Traditional wide band amplifiers require very expensive external tracking filters, e.g., an external balun. Thus, because differential circuits and in particular differential circuits with external baluns minimize second and third order effects, they are used, overwhelmingly, in high performance narrow band applications to maximize amplification linearity.

For many applications an external balun or other tracking filter is prohibitively expensive and, an on-chip single ended (single phased) input to differential (output) converter is necessary to maintain acceptable linearity and dynamic range. Prior single ended to differential conversion approaches have resulted in circuits, typically bipolar, with limited dynamic operating range and still some sensitivity to second and third order effects especially at the extremes of that operating range, as well as device noise sensitivity, e.g. from device mismatches. While second and third order effects could be further reduced, that reduction was at a cost of even further limiting amplifier dynamic operating range.

Further, these single ended to differential bipolar amplifiers do not lend themselves to a field effect transistor (FET) analog. In particular, FET thresholds vary disproportionately for low back gate bias voltages (i.e., the voltage between the device channel and the bulk substrate) such that, because of bias conditions, identical devices may have different thresholds. So, threshold voltages for two matched FETs may exhibit a significant mismatch which reduces linearity. Thus, even if devices are identical by design, device configuration and bias voltages may be mismatched to cause a transconductance mismatch, severely degrading operation of such an FET amplifier.

Thus, there is a need for a single ended input to differential output linear amplifier with a wide dynamic operating range, improved gain and minimal second and third order effect degradation.

BRIEF DESCRIPTION OF THE DRAWINGS

The foregoing and other objects, aspects and advantages will be better understood from the following detailed preferred embodiment description with reference to the drawings, in which.

DETAILED DESCRIPTION OF A PREFERRED EMBODIMENT OF THE INVENTION

Figure 1:
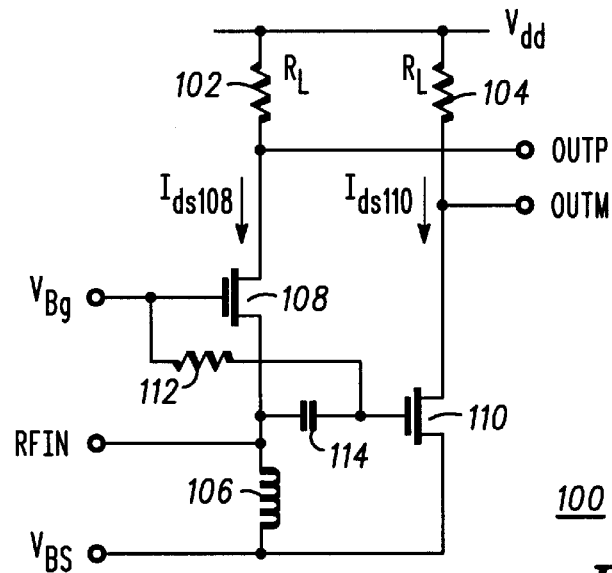
FIG. 1 shows a schematic of a first embodiment of a single-ended input differential output amplifier.

Turning now to the drawings, FIG. 1 schematically shows an example of a first embodiment single ended input differential output amplifier 100 according to the present invention. A matched pair of load resistors 102, 104, typically 200Ω each, connect a supply voltage ($V_{dd}$) to a corresponding differential output OUTP and OUTM. An inductor 106, typically 1000 nh, connects input RFIN to a reference voltage $V_{BS}$. The bulk substrate for FETs 108, 110 is grounded. A first field effect transistor (FET) 108 (n-type in this example) connects, drain to source, between load resistor 102 at output OUTP and inductor 106 at RFIN. A second FET 110 (also n-type in this example) connects, drain to source, between the second load resistor 104 at output OUTM and the reference voltage $V_{BS}$. A gate bias resistor 112, typically 50 kΩ, connects between the gates of FETs 108, 110. A gate bias voltage ($V_{Bg}$) connects to the gate of FET 108 and resistor 112. A coupling capacitor 114, typically 5 pf, connects between the input RFIN and the gate of FET 110. (Normally, although the amplifier 100 may be substantially contained on a single integrated circuit (IC) chip, inductor 106 is a separate independently formed element and connects to transistors 108, 110 through individual chip input/output (I/O) pads (not shown in FIG. 1) and chip wiring.)

Resistor 112 passes the gate bias voltage $V_{Bg}$ to the gate of FET 110. Inductor 106 passes reference voltage $V_{BS}$ to the source of FET 108. Preferably, reference voltage, $V_{BS}$, is 0.5 volts. At steady state, $V_{Bg}$ is such that both FETs 108 and 110 are turned on and in saturation with current flowing through resistors 102, 104, to set the same static operating point voltage ($V_{OP}$) at OUTP and OUTM, i.e. $V_{OUTP}=V_{OUTM}$. So, at steady state with no input signal, the output signal is $0=V_{OUTP}-V_{OUTM}$.

In saturation each FET's drain to source voltage ($V_{ds}$) is greater than its gate to source voltage ($V_{gs}$) less its threshold voltage ($V_T$), i.e., $$V_{ds} > V_{gs} - V_T.$$

At steady state:

$$I_{ds108} = I_{ds110}$$

$$V_{outp} = V_{dd} - I_{ds108} * R_L$$

$$V_{outm} = V_{dd} - I_{ds110} * R_L$$

where $I_{ds108}$, $I_{ds110}$ are the drain to source currents of FETs 108 and 110, respectively. A FET in saturation acts as a voltage controlled current source, with device drain to source current ($I_{ds}$) essentially being directly proportional to $(V_{gs}-V_T)^2$ and independent of $V_{ds}$. For small signal applications, (i.e., applications where the signal ranges over a small portion of the signal response range) FET drain current variation ($\Delta I_{ds}$) may be approximated by $$\Delta I_{ds} \cong \Gamma \Delta V_{gs}$$

So, the output signal, which is the differential variation in output voltages $V_{outp}$ and $V_{outm}$, i.e., $\Delta V_{outp,m}$ is proportional to $\Gamma \Delta V_{gs}$ where $\Gamma$ is device transconductance. $V_{gs}$ is a function of the gate bias voltage $V_{Bg}$, the source voltage of each FET and input signal $V_{RFIN}$. A high frequency signal (such as radio frequency) provided to RFIN sees the inductor 106 as an open circuit and the coupling capacitor 114 as a short circuit. Any RF input signal driving the source of the non-inverting FET 108, effectively, is inverted at the gate of device 108. Coupling capacitor 114 couples the RF input signal, uninverted, to the gate of the inverting common source device 110.

For FET 108, $$\Delta V_{gs} = -V_{RFIN}$$

and for FET 110, $$\Delta V_{gs} = +V_{RFIN}$$

So, $$\Delta V_{outp} \cong +\Gamma V_{RFIN} R_L$$

$$\Delta V_{outm} \cong -\Gamma V_{RFIN} R_L$$

While the above holds true for small input signals, linearity concerns arise for larger input signals, where the small signal approximation is not valid and $I_{ds}$ must be treated as proportional to $(V_{gs}-V_T)^2$. Thus, the preferred embodiment of the present invention is a common gate/common source structure with a single ended directly connected input phase and a capacitively coupled differential input phase. Under ideal, noise-free operating conditions or, when available area limits amplifier size, the first embodiment of FIG. 1 is an acceptable single ended input to a differential output amplifier and is an improvement over prior art approaches.

However, conditions are seldom ideal and, so, other noise and non-linearity sources must be addressed. Such other source include local noise that is coupled into the amplifier such as from parasitic capacitance introduced by connecting off chip inductor 106 to the integrated amplifier of FIG. 1. Typically, chip I/O pads are provided for connecting to the IC chip. These chip I/O pads may be a source of parasitic capacitance. Also, surface spreading resistance at the pads may result in localized noise or other noise injected into on-chip supply lines, etc. from other chip circuits may be felt at the pads and unintentionally introduced to a single ended amplifier input. Noise from these noise sources and parasitic capacitance may impair the first single ended to differential embodiment circuit 100 of FIG. 1.

Figure 2:
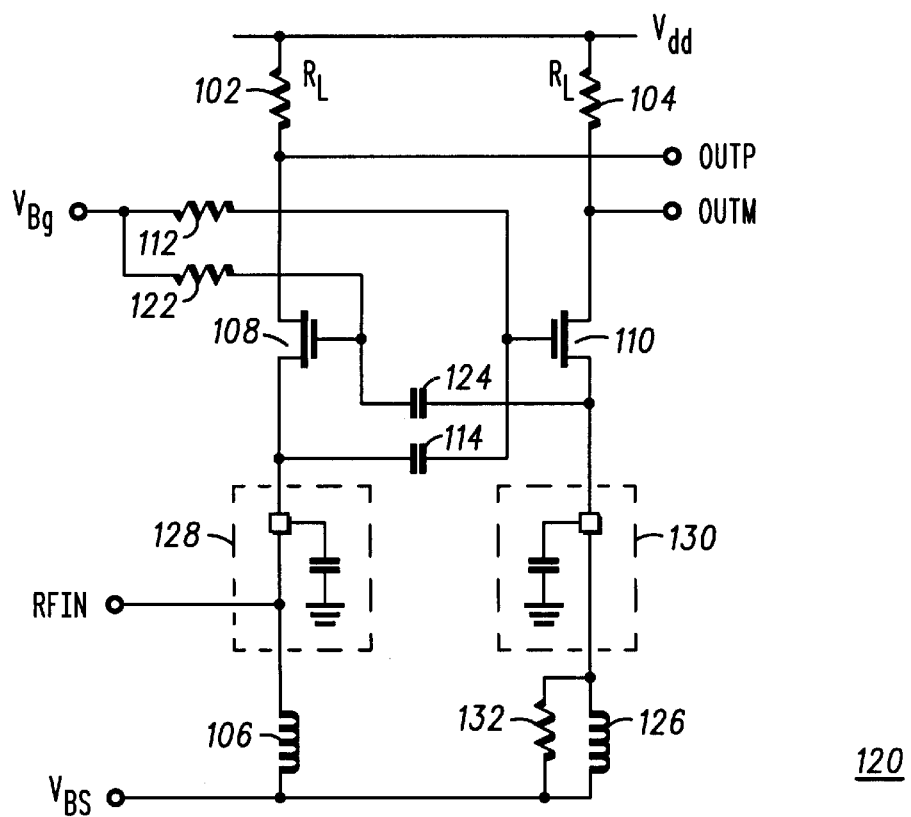
FIG. 2 shows a schematic of a preferred embodiment single ended input differential output amplifier.

Accordingly, FIG. 2 shows a preferred embodiment single ended input differential output amplifier 120 according to the present invention. The preferred embodiment of 120 of FIG. 2 is substantially similar to the first embodiment 100 of FIG. 1 with like elements labeled identically. However, the preferred embodiment amplifier 120 includes a second bias resistor 122, second coupling capacitor 124 and a second off chip inductor 126. Parasitic capacitances are also shown at representative chip I/O pads 128, 130. An impedance matching resistor 132 is included in parallel with inductor 126 between I/O pad 130 and VBS.

Accordingly, the preferred embodiment 120, as with any well known differential amplifier, exhibits excellent common mode rejection for such on-chip noise such as is described hereinabove. Furthermore, it should be appreciated that the preferred embodiment 120 is readily adaptable as a differential-in and differential-out amplifier, simply by providing a differential input signal to I/O pads 128, 130 and omitting impedance matching resistor 132.

Other than the additional noise compensation provided by second bias resistor 122, second coupling capacitor 124 and second inductor 126, the preferred embodiment amplifier 120 functions identically to the first embodiment amplifier 100. Impedance matching resistor 132 is selected to be equal to the characteristic impedance of the input signal line, e.g., a 50Ω coaxial cable connected between VBS and RFIN. Again, if no noise arises at chip I/O pads 128, 130, second resistor 122, second coupling capacitor 124 and second inductor 126 are superfluous and the first embodiment 100 is adequate.

Optionally, although not shown, cascode gain control, as is well known in the art may be included by connecting a series FET between the drain of each of FETs 108, 110 and outputs OUTP, OUTM, respectively. An additional shunt FET would also connect between the drain of each of FETs 108, 110 and $V_{dd}$. Thus, amplifier gain may be controlled by selectively reducing current through the series connected FETs, while compensating for any such reduced current with shunt FET current, such that current through FETs 108, 110 remains unchanged.

Accordingly for both embodiments 100, 120, by capacitively coupling the input signal to the gate of one FET 110, the drain to source steady state voltage of both devices is equal and maximum, providing improved linearity and reducing second and third order effects. Furthermore, the sources of both input devices ($V_{BS}$), preferably, are biased to the same voltage above ground to avoid non linearity that can result from rapid back-biased induced transconductance variations which are inherent in such devices at low back-bias voltages. Finally, by inductively coupling the bias voltage to the source of FET 108, the single ended to differential amplifier exhibits lower noise while providing significantly improved higher gain than such prior art amplifiers.

While the invention has been described in terms of preferred embodiments, those skilled in the art will recognize that the invention can be practiced with modification within the spirit and scope of the appended claims.

We claim:

1. A single ended input differential output amplifier comprising:
    a first transistor connected between a first output and a reference voltage,
    a second transistor connected between a second output and said reference voltage,
    a bias voltage coupled to a control terminal of each of said first transistor and said second transistor;
    a first capacitor connected between said control terminal of said first transistor and a conduction terminal of said second transistor; and
    an input signal connected to a conduction terminal of said first transistor and coupled to said control terminal of said second transistor.

2. A single ended input differential output amplifier as in claim 1 wherein said input signal is coupled to said control terminal of said second transistor through a second capacitor and said reference voltage is coupled to said conduction terminal of said first transistor through an inductor.

3. A single ended input differential output amplifier as in claim 2 wherein said second capacitor is connected at one terminal to said conduction terminal of said first transistor and at an opposite terminal to said control terminal of said second transistor.

4. A single ended input differential output amplifier as in claim 3 wherein a bias resistor connected to said control terminal of said first transistor couples said bias voltage to said control terminal of said second transistor.

5. A single ended input differential output amplifier as in claim 4 further comprising a matched pair of load resistors, each of said matched pair being connected between a supply voltage and a corresponding one of said first output and said second output.

6. A single ended input differential output amplifier as in claim 5 wherein said first transistor and second transistor are field effect transistors (FETs) and each said control terminal is each said FET's gate.

7. A single ended input differential output amplifier as in claim 6 wherein said FETs are n-type FETs (NFETs), said conduction terminal being said first NFET's source.

8. A single ended input differential output as in claim 7 wherein said bias voltage is connected to said gate of said first NFET, said first output is connected to the drain of said first NFET and said second output is connected to the drain of said second NFET.

9. A single ended input differential output amplifier as in claim 7 further comprising:
 a second bias resistor coupling said bias voltage to said gate of said first NFET.

10. A single ended input differential output amplifier comprising:
 a first transistor connected between a first output and a reference voltage;
 a second transistor connected between a second output and said reference voltage;
 a bias voltage coupled to a control terminal of each of said first transistor and said second transistor;
 an input signal connected to a conduction terminal of said first transistor and coupled to said control terminal of said second transistor; and
 an impedance matching resistor and an inductor connected in parallel between said reference voltage and a conduction terminal of said second transistor.

11. A single ended input differential output amplifier comprising:
 a first field effect transistor (FET) connected drain to source between a first output and a reference voltage;
 a second FET connected drain to source between a second output and said reference voltage;
 a bias voltage coupled to a gate of said first FET and a gate of said second FET;
 an input signal connected to the source of said first FET and coupled to said gate of said second FET;
 a first coupling capacitor connected between said source of said second FET and said gate of said first FET; and
 a matched pair of load resistors, each of said matched pair connected between a supply voltage and a corresponding one of said first output and said second output.

12. A single ended input differential output amplifier as in claim 11 further comprising:
 a second coupling capacitor connected at one end to said input signal and at an opposite end to said gate of said second FET; and
 an inductor connected at one end to said reference voltage and at an opposite end of said source of said first FET.

13. A single ended input differential output amplifier as in claim 12 further comprising a first bias resistor connected between said gate of said second FET and said bias voltage.

14. A single ended input differential output amplifier as in claim 13 wherein said FETs are n-type FETs (NFETs).

15. A single ended input differential output amplifier as in claim 14 wherein said bias voltage is connected to said gate of said first NFET through a second resistor, said first output is connected to the drain of said first NFET and said second output is connected to the drain of said second NFET.

16. A single ended input differential output amplifier as in claim 14 further comprising:
 a second bias resistor connected between said bias voltage and said gate of said first NFET.

17. An integrated circuit chip comprising a single ended input differential output amplifier as in claim 14, said bias voltage and said input signal each being provided to a chip input/output (I/O) pad.

18. An amplifier adaptable for use as either a differential amplifier or a single ended input differential output amplifier, said amplifier comprising:
 a first field effect transistor (FET) connected drain to source between a first output and a first chip input/output (I/O) pad;
 a second FET, connected drain to source between a second output and a second chip I/O pad;
 a first bias resistor connected between a bias voltage and a gate of said first FET;
 a second bias resistor connected between said bias voltage and a gate of said second FET;
 a first coupling capacitor connected between said first I/O pad and said gate of said second FET;
 a second coupling capacitor connected between said second I/O pad and said gate of said first FET; and
 a matched pair of load resistors, each of said matched pair connected between a supply voltage and a corresponding one of said first output and said second output.

19. An amplifier as in claim 18 wherein said first FET and said second FET are n-type FETs.

20. An amplifier as in claim 19 wherein a differential signal is provided to said first and second chip I/O pads, said amplifier providing a differential output responsive to said differential input signal.

21. An amplifier as in claim 19, further comprising an inductor connected between said first and second chip I/O pads, a reference voltage being provided to said second chip I/O pad and an input signal being provided to said first chip I/O pad, said amplifier providing a differential output responsive to said input signal.

22. An amplifier as in claim 19, wherein said drain of said first NFET is connected to said first output and said drain of said second NFET is connected to said second output.

23. An amplifier as in claim 19 further comprising:
 a first inductor connected between said first chip I/O pad and said reference voltage;
 a second inductor connected between said second chip I/O pad and said reference voltage;
 an impedance matching resistor connected in parallel with said second inductor; and
 an input signal being provided across said first inductor.

24. An amplifier as in claim 19 further comprising:
 a first inductor connected between said first chip I/O pad and said reference voltage;
 a second inductor connected between said second chip I/O pad and said reference voltage; and
 a differential input signal being provided to said first I/O pad and said second I/O pad.

25. An integrated circuit chip comprising an amplifier as in claim 19.

* * * * *